United States Patent
Chieh

(10) Patent No.: US 10,014,276 B2
(45) Date of Patent: Jul. 3, 2018

(54) COMPENSATION OF BONDWIRES IN THE MICROWAVE REGIME

(71) Applicant: Jia-Chi Samuel Chieh, San Diego, CA (US)

(72) Inventor: Jia-Chi Samuel Chieh, San Diego, CA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 638 days.

(21) Appl. No.: 14/631,635

(22) Filed: Feb. 25, 2015

(65) Prior Publication Data

US 2016/0247752 A1   Aug. 25, 2016

(51) Int. Cl.
*H01L 23/00* (2006.01)
*H01L 23/498* (2006.01)
*H01L 23/66* (2006.01)

(52) U.S. Cl.
CPC ........ *H01L 24/85* (2013.01); *H01L 23/49838* (2013.01); *H01L 23/66* (2013.01); *H01L 24/48* (2013.01); *H01L 24/49* (2013.01); *H01L 2223/6611* (2013.01); *H01L 2224/48091* (2013.01); *H01L 2224/48105* (2013.01); *H01L 2224/48135* (2013.01); *H01L 2224/48227* (2013.01); *H01L 2224/49171* (2013.01); *H01L 2924/00014* (2013.01); *H01L 2924/00015* (2013.01); *H01L 2924/30107* (2013.01)

(58) Field of Classification Search
CPC .......... H01L 2224/48091; H01L 24/49; H01L 2924/30107; H01L 2924/00015; H01L 2224/49171
See application file for complete search history.

(56) References Cited

U.S. PATENT DOCUMENTS 6,201,454 B1   3/2001 Kinayman et al.
6,399,894 B1   6/2002 Albinsson et al.
(Continued)

OTHER PUBLICATIONS

Zhang, Y.P. et al., "Antenna-in-Package Design for Wirebond Interconnection to Highly Integrated 60-GHz Radios", IEEE Transactions on Antennas and Propagation, vol. 58, No. 10, Oct. 2009, pp. 2842-2852.

*Primary Examiner* — Ali Naraghi
*Assistant Examiner* — Krista Soderholm
(74) *Attorney, Agent, or Firm* — SSC Pacific Patent Office; Arthur K. Samora; Kyle Eppele

(57) ABSTRACT

A method for connecting an integrated circuit (IC) to a printed circuit board (PCB) can include the steps of fixing the IC and the PCB to a dielectric substrate. A single wire bond can be used to bond the IC to the PCB, and a ground plane can be established for the PCB. To minimize inductance losses at high frequency operation, a ground plane defect can be intentionally established by forming at least one opening in the ground plane. The opening can be rectangular when viewed in top plan, although the number of openings formed and opening geometry can be chosen according to the desired operating frequency of the device. The defect can allow for single wire bonding of the IC to the PCB in a manner which allows for high frequency operation without requiring the integration of additional matching network components on the IC and PCB.

4 Claims, 6 Drawing Sheets

(56) References Cited

U.S. PATENT DOCUMENTS

| | | | |
|---|---|---|---|
| 8,907,470 B2* | 12/2014 | Ding | H01L 23/49838 |
| | | | 257/692 |
| 2007/0138628 A1* | 6/2007 | Lam | H01L 25/0652 |
| | | | 257/723 |

* cited by examiner

COMPENSATION OF BONDWIRES IN THE MICROWAVE REGIME

FEDERALLY-SPONSORED RESEARCH AND DEVELOPMENT

This invention (Navy Case No. 102204) is assigned to the United States Government and is available for licensing for commercial purposes. Licensing and technical inquires may be directed to the Office of Research and Technical Applications, Space and Naval Warfare Systems Center, Pacific, Code 72120, San Diego, Calif. 92152; voice (619) 553-5118; email ssc_pac_T2@navy.mil.

FIELD OF THE INVENTION

The present invention pertains generally to the connection of integrated circuits to printed circuit boards. More specifically, the present invention pertains to the connection of integrated circuits to printed circuit boards using wire bonds. The invention is particularly, but not exclusively, useful for the connection of integrated circuits to printed circuit boards using wire bonds in a manner which allows for high frequency operation.

BACKGROUND OF THE INVENTION

Wire bonds are often used to connect an integrated circuit (IC) to a printed circuit board (PCB). Sometimes, these wire bonds are used to route direct current (DC) biasing voltages or currents to a chip on the IC, in order to control the operation of the chip. During low frequency operations, the negative effects of utilizing a wire bond are not experienced. However, for high speed/frequency radiofrequency (RF) microwave signals, any discontinuity in the signal path caused by wire bonding can significantly degrade the quality of the signal. This can be because a wire bond is inductive in nature, and at high frequencies, an inductor is open in nature, which can allow very little of the signal to pass through. Therefore, compensation of this wire bond inductance must be implemented.

Various methods can be used to mitigate wire bond losses at high frequency. One method is to lower the inductance by using two or three wire bonds in parallel, thereby lowering the effective inductance. Ribbon bonds, which are wider than wire bonds and lower in inductance, can also be utilized. Compensation techniques are also popular. Compensation methods can usually implement additional capacitors and inductors directly on the PCB so that the PCB inductance "matches" the IC impedance. Although these standard compensation techniques are prevalent, there is generally a limitation to the values of the matching network elements which can be realized using a PCB, and therefore a limit in the frequency of operation that can be obtained.

In view of the above, it is an object of the present invention to provide a device and method for connecting an IC to a PCB using a single wire bond in a manner that allows for high frequency of operation with less return losses. A further object of the present invention is to provide a device and method for connecting an IC to a PCB using a wire bond and a defective ground plane in order to achieve broadband performance. Another object of the present invention is to provide a device and method for connecting an IC to a PCB using a wire bond in a manner that allows for high frequency of operation without requiring matching network components on the IC. Still another object of the present invention is to provide a device and method for connecting an IC to a PCB using a single wire bond, without requiring multiple wire bonds or wire ribbons. Yet another object of the present invention to provide a device and method for connecting an integrated circuit to a printed circuit board with a wire bond for high frequency of operation, which is easy to manufacture, that is inexpensive, and that is easy to use.

SUMMARY OF THE INVENTION

A method for connecting an integrated circuit (IC) to a printed circuit board (PCB) using a wire bond to allow for high frequency of operation (and resulting device) can include the steps of fixing the IC to a dielectric substrate, and fastening the PCB to the substrate. A wire bond can be used to bond the IC to the PCB, and a ground plane can be established for the PCB. To minimize losses due to mismatch caused by the wire bond at high frequency operation, a defect can be intentionally formed in the ground plane. The defect can be established by forming at least one opening in the ground plane.

The geometry of the opening can be selected according to the desired operating frequency for the resulting device. In several embodiments, the opening can be rectangular when viewed in top plan; the size, number and orientation of the rectangular slot can be chosen according to the desired operating frequency of the device. Other geometries such as crescents and triangles can also be used. The defect can allow for bonding of the IC to the PCB in a manner which allows for high frequency operation without requiring the integration of matching network components on the IC and PCB.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE EMBODIMENTS

As defined herein and used in this specification, the term "printed circuit board" can mean a device that mechanically supports and electrically connects electronic components using conductive tracks, pads and other features etched from copper sheets laminated onto a non-conductive substrate. The term "integrated circuit" can mean a set of electronic circuits on one small plate ("chip") of semiconductor material.

In brief overview, when wire bonding integrated circuits (IC's) to printed circuit boards (PCB's), the impedance of the inductance of a wirebond can be characterized by:

$$Z_L = j\omega L. \qquad \text{Eq. (1)}$$

From Equation (1), it can be seen that as the frequency of operation ω increases, the wirebond impedance $Z_L$ also increases. Similarly, as the inductance L increases, the wirebond impedance $Z_L$ also increases. Therefore for high frequency operation, in the RF microwave/millimeter wave regime (at frequencies roughly between 300 MHz and 3 GHz), an inductor can look like an open circuit, which can further prevent high frequency signals from propagating. In order to mitigate this phenomenon, various methods can be employed in order to reduce the overall inductance of the wire bonds by using multiple wire bonds in parallel or by using a ribbon bond which is also lower in inductance. These methods can be sufficient for operation in the EHF frequencies (30-300 GHz), but beyond EHF frequencies, any inductance can degrade the propagating RF signal.

Flip chip methods can be used in lieu of wire bonding to mitigate unwanted inductance at high frequency operations. Flip chip methods can use a small solder bump in order to connect IC's to PCB's. These bumps can be much smaller than typical bondwires and thus lower in inductance as well. However, flip chip methods can be more costly to implement than wire bond methods, and wire bonds are typically favored for cost reasons. For this reason, wire bonds can be often be used, and compensation techniques can often be used to mitigate the inductive effect of the wire bond method at high frequency operation.

Figure 1:
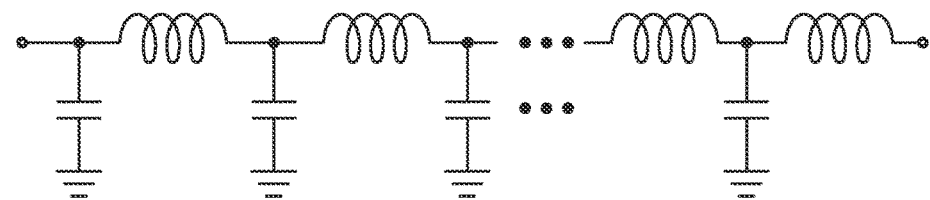
FIG. 1 is a prior art electrical circuit representation of a lumped model compensation scheme when wire bonding integrated circuits to printed circuit boards.

Referring initially to FIG. 1, an electrical representation of a lumped model compensation scheme in the prior art when wire bonding IC's to PCB's can be shown, and can be generally designated by reference character 10. The most standard compensation techniques can include incorporating the bond wire inductance into a model 10 which can have an equivalent transmission line circuit having a design characteristic impedance. For most RF systems, the characteristic impedance is 50Ω. Circuit 10 in FIG. 1 depicts the electrical representation of the lumped model for a transmission line.

Figure 2:
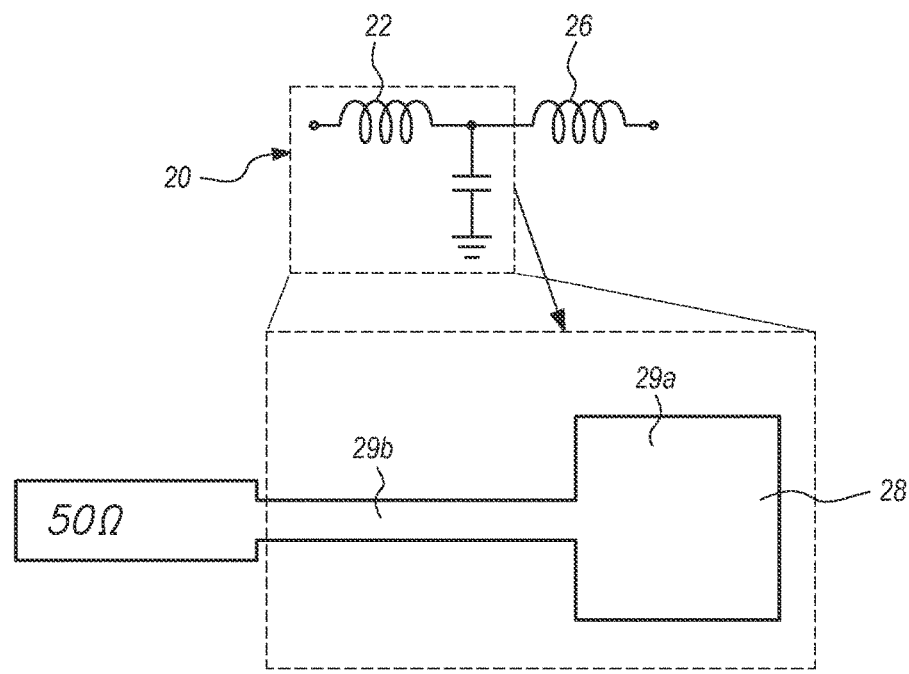
FIG. 2 is a block diagram of a typical wire bond compensation scheme in the prior art.
Figure 3:
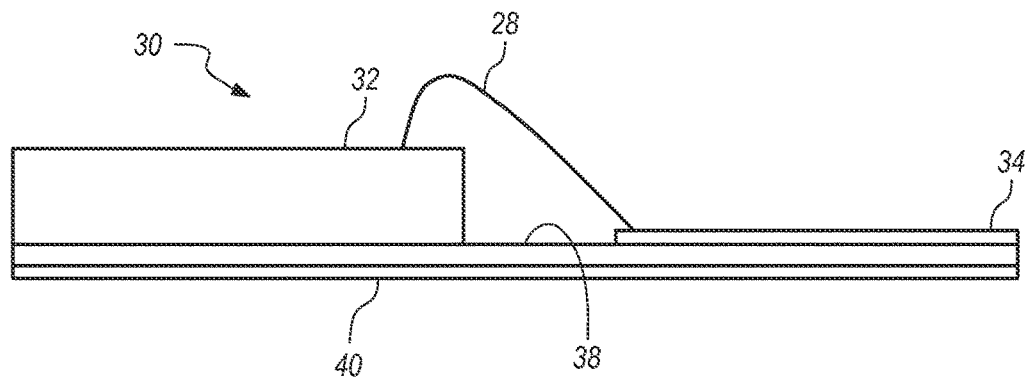
FIG. 3 is a prior art side elevational view of the compensation scheme of FIG. 2.
Figure 4:
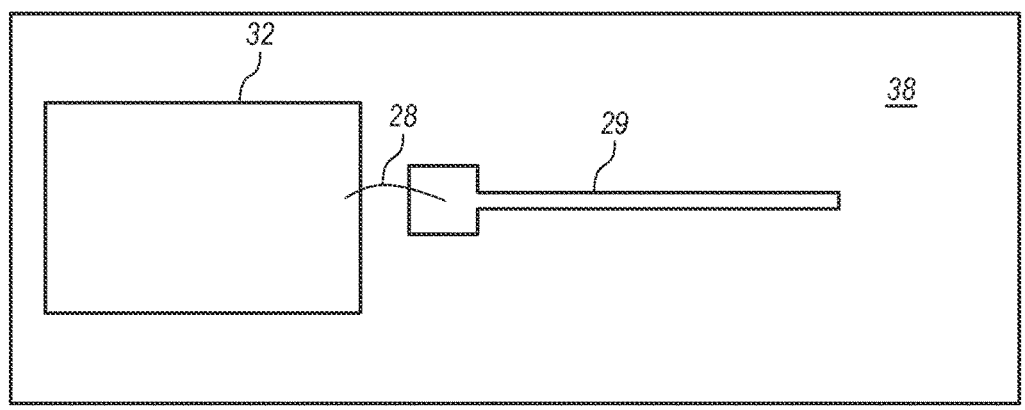
FIG. 4 is a prior art top plan view of the scheme of FIG. 3.

The compensation method that is most commonly used is to decompose this lumped element model into T-network unit cells. Referring now to FIGS. 2-4, these T-networks 20 can consist of a series inductor 22, shunt capacitor 24, and series inductor 26, which can be repeated for a certain electrical length. Wire bond 28 can introduce a discontinuity in the T-network model 20, so therefore the other two components in the T-network can be adjusted so that the characteristic impedance of the transmission line remains the designed value, usually 50Ω. The method of choice in order to adjust the other two components in the unit cell can be to implement shunt capacitor 24 and series inductor 26 directly on the PCB substrate using traces 29. Referring to FIG. 2, trace 29 of device 30 can be the physical implementation of compensation T-network 20 of FIG. 2. PCB traces 29a which are short and wide (low impedance) can typically be capacitive in nature, where the capacitance resulting from the parallel plate capacitance from the short and wide trace 29a to ground. PCB traces 29b that are long and narrow (high impedance) can typically be inductive in nature. An example of this type of compensation network is shown in FIG. 2. A side profile of device 30 that uses this technique is shown in FIGS. 3 and 4. In FIGS. 3 and 4, the prior art device 30 can in include an IC 32 that is fixed to a PCB 34 on top of substrate 38, which is further fixed onto ground plane 40. The IC 32 is connected to PCB 34 using wire bond 28. A top view of this technique is shown in FIG. 4.

Figure 5:
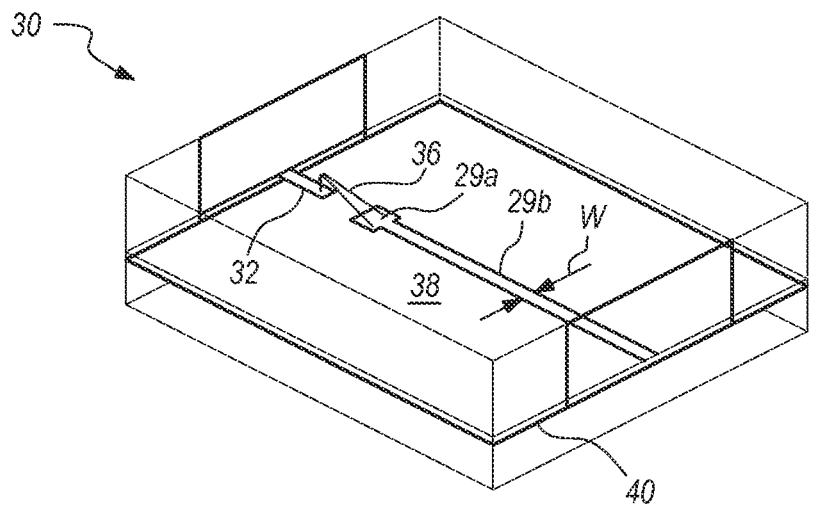
FIG. 5 is a prior art illustration of a wire bond compensation model, which illustrates fabrication limitations that can limit prior art compensation schemes.

The above-described compensation method can be useful for many RF microwave applications; however the compensation network 20 can still have certain limitations. More specifically, for many RF microwave applications, it can be advantageous to use a material for substrate 38 which has a low dielectric constant and which is also very thin. The use of this type of substrate 38 can produce transmission lines which are less lossy, and which are also very narrow, which can further make the transmission line compatible with interfacing with an integrated circuit. However, because these traces are very narrow, fabrication tolerances can dictate a limit, beyond which the width "w" of the inductive portion of trace 29a (see FIG. 5) cannot be etched. Therefore, when using such thin substrates, the limitations of the fabrication process can often dictate the practical implementation. For example, most PCB fabrication facilities are able to etch traces with a minimum width of 3 mils. If a width of less than 3 mils is needed to match network components, then the compensation scheme is not feasible for a particular application. For that reason, and referring again to FIG. 5, often times realizing the capacitor element 34a for the compensation is achievable; however the realization of the high impedance inductive line 34b is not achievable using current fabrication methods known in the art. FIG. 5 illustrates an example of this circumstance. In FIG. 5, the compensation inductor goes beyond fabrication tolerance, and therefore is not achievable.

Figure 6:
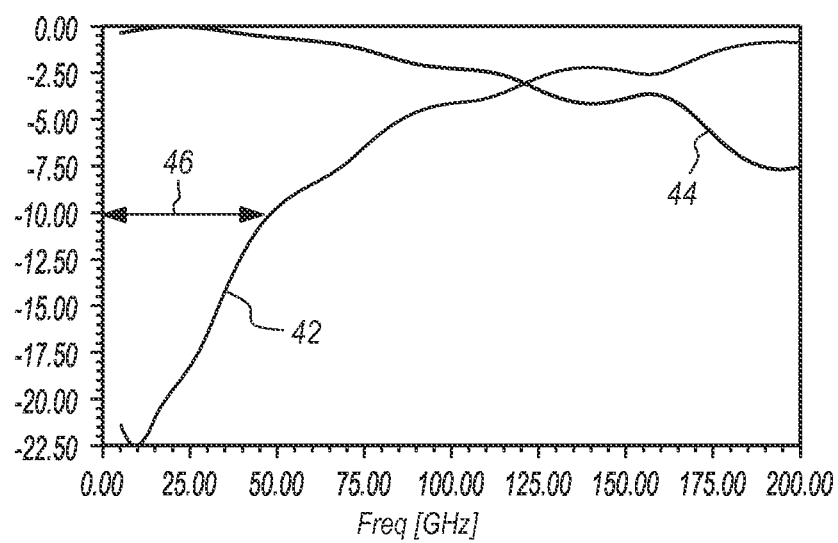
FIG. 6 is a graph of gain versus frequency for a prior art device, which illustrates the limitations of the prior art wire bond compensation schemes at high operation frequencies.

Referring now to FIG. 6, a graph of return losses versus operating frequency of a device that uses prior art wire bonding and PCB fabrication methods (the device of FIG. 5) is shown. FIG. 6 can be used to illustrate the resulting performance limitations for the prior art device which was manufactured using the limited fabrication methods described above. As can be seen from FIG. 6, the return loss (which is depicted by curve 42) is below −10 dB up until 50 GHz. But above 60 GHz (and using −10 dB as the acceptable return loss, other acceptable return losses could be defined), the return loss is less than −10 dB, which can mean that the device cannot have an operating frequencies above 50 GHz without incurring unacceptable return losses. Similarly, curve 44 represents the insertion loss, which should be as closed to 0 dB as possible. From FIG. 6, it can be seen that about roughly 35 GHz, the insertion loss becomes noticeable, which, again is an undesirable condition that is present in the prior art.

Figure 7:
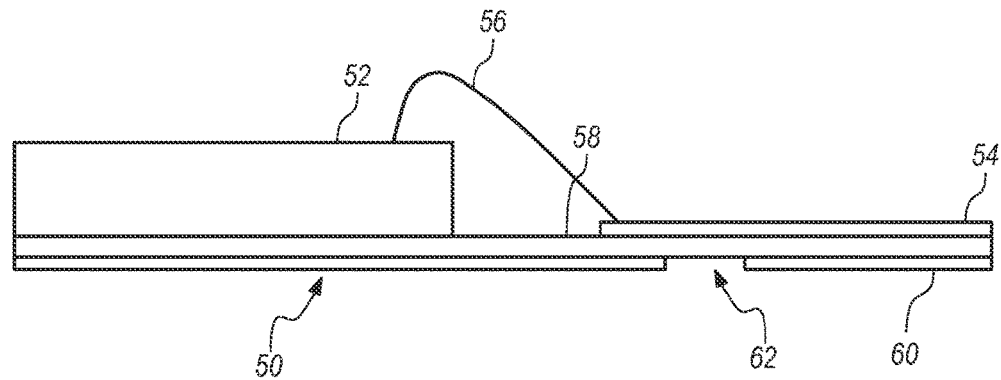
FIG. 7 is a side elevational view of the device of the present invention according to several embodiments.

Referring now to FIG. 7, the device of the present invention according to several embodiments is shown and is generally designated by reference character 50. The device and methods of the present invention can overcome the above-described limitations. As shown in FIG. 7, device 50 can include an IC 52 and a PCB 54 that can be connected with bondwire 56. IC 52 and PCB 54 can be fixed to substrate 58. Ground plane 60 can also be fixed to substrate 58. For the device and methods of the present invention, a high inductance can be achieved without making a trace 29 more narrow by intentionally defecting the ground plane 60, i.e., by establishing an opening 62 in the ground plane. The opening 62 can establish a defect in the ground plane 60, which can further disrupt the current return path, elongating the return path, and thereby making the device more inductive.

Figure 8:
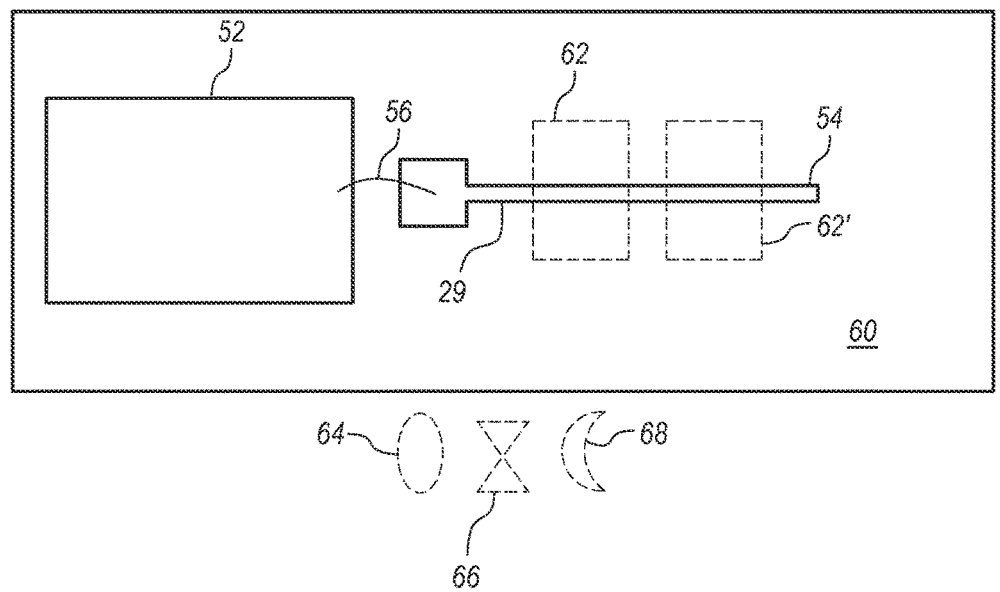
FIG. 8 is a top plan view of the device of FIG. 7.
Figure 9:
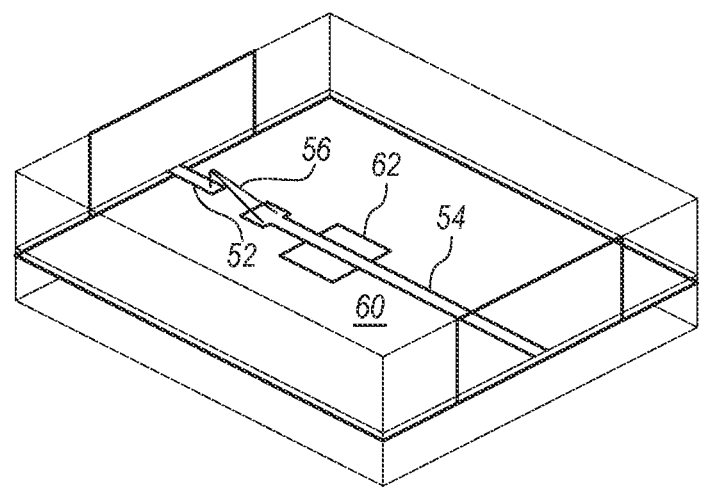
FIG. 9 is a side elevational view of the device of FIG. 8, which the ground plan defect shown in phantom for increased clarity.

As shown in FIGS. 8-9, the defect in the ground plane 60 (opening 62) can have the geometry of a rectangular slot when viewed in top plan. The size and orientation of the rectangular opening(s) 62 needed to establish the defect, to achieve the effective inductance, can be chosen by the operator according to the design parameters and applications for the device. Such parameters can include, but are not limited to, the design RF frequency for the device 50 and the thickness of the substrate 58. Additionally, and as shown in FIG. 8, other geometries could be used, such as an oval 64, triangular 66 and crescent 68 shapes for the opening 62. In addition, multiple defects in the ground plane can also be used in order to further increase the effective inductance of the line, as shown by openings 62 and 62' in FIG. 8. From FIGS. 7-9, it can be seen that by defecting the ground plane 60 beneath a transmission line, the inductance of the line can be increased, without the need of making narrower traces 29. This can significantly extend the frequency of operation for microwave Microwave Integrated Circuits (MIC's), which can essentially be the integration of an IC and a PCB, and which can also be referred to as a module, and which can be constrained by fabrication tolerances as described above.

Figure 10:
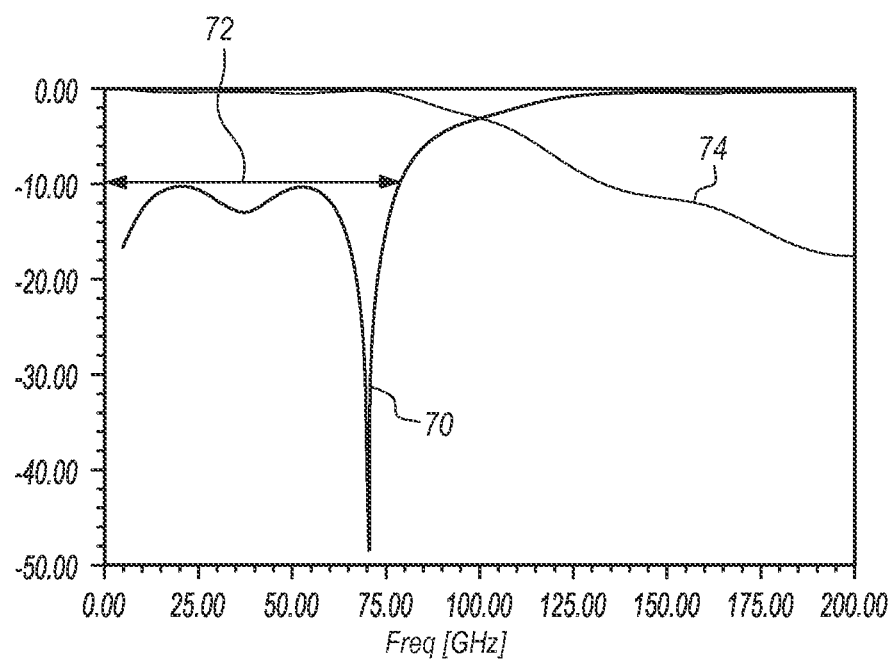
FIG. 10 is a graph of gain versus frequency for the device of FIG. 9.

Referring now to FIG. 10, a graph of return losses versus operating frequency of a device of the present invention is shown. FIG. 10 can be used to illustrate the improvement in performance for the device 50 of the present invention, when compared to the prior art. As can be seen from FIG. 10, the return loss (which is depicted by curve 70) remains below −10 dB up until approximately 75 GHz. Stated differently, for the same IC and PCB of the prior art, the operating frequency range 72 of the device can be extended from 50 GHz to 75 GHz without incurring additional return losses, simply by establishing a defect in the ground plane 60. Similarly, the insertion loss (curve 74) can remain closer to 0 dB for a wider frequency range, through 75 GHz. This is the actual transmission signal loss for the device, which is be minimized for the MIC of the present invention.

The advantage of this method is that for designs which are constraint by PCB fabrication tolerances, high impedance traces can still be realized in order to compensate for the detrimental effects of the wire bond. This method can extend the frequency of operation also for fabrication constrained systems. This method also makes possible the use of wire bonds for high GHz operation, where flip chip technology is typically used. Flip chip technology is a more costly and complex method as compared to this one.

Figure 11:
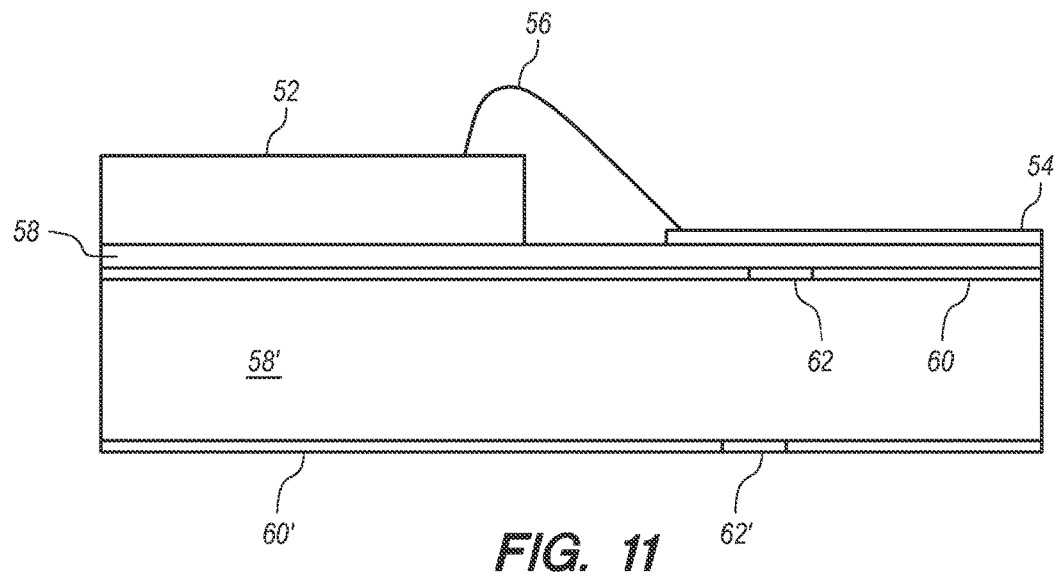
FIG. 11 is a side elevational view of an alternative embodiment of the device of FIG. 7; and, FIG. 12 is a block diagram, which illustrates steps that can be taken to accomplish the methods of the present invention according to several embodiments.

Referring now to FIG. 11, alternative embodiments for the device of the present invention can be shown. For designs that require the bottom layer to be a ground layer, multiple substrates 58, 58' and ground planes 60, 60' could be used. For these embodiments, an intermediate layer (ground plane 60) and a bottom layer (ground plane 60') can both be ground planes. A defect (opening 62) in the intermediate layer (ground plane 60) would render the bottom layer a ground plane 60', and therefore raise the effective inductance of the RF trace. Or, multiple openings 62, 62' can be formed in respective ground planes 60, 60' as need to compensate for the wirebond inductance at higher operation frequencies. The above configurations can be shown in FIG. 11.

Figure 12:
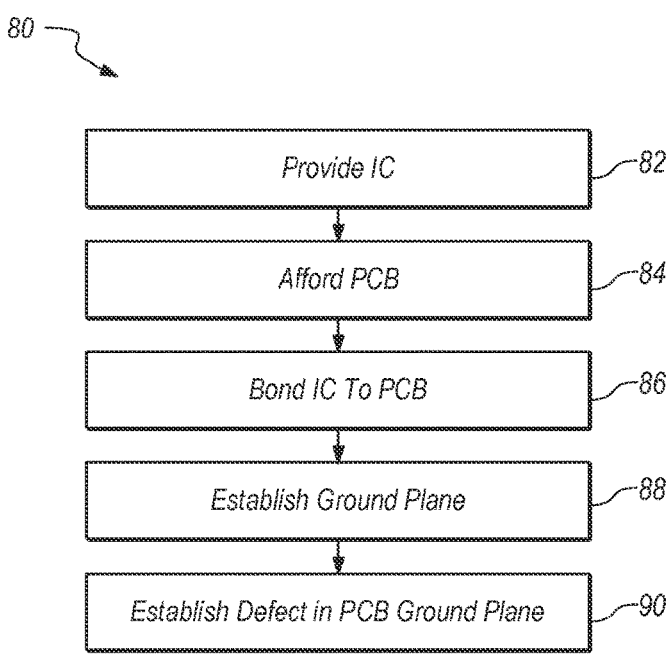

Referring now to FIG. 12, a block diagram illustrating steps that can be taken to practice the methods of the present invention according to several embodiments can be shown and can be designated using reference character 80. As shown, method 80 can include initial steps 82 and 84 of providing an IC and affording a PCB, respectively. IC 52 can be connected to PCB 54 using a wire bond 56, as depicted by box 86. Still further, a ground plane for the device can be established, as shown by step 88, and the ground plane can be defected, as indicated by step 90. The defect can be an opening 62, as described above. The number and geometry of defects can be chosen according to operator's needs, as described above.

It should also be appreciated that methods of the present invention according to several embodiments are not limited to wirebonding an IC to PCB to establish an IC-to-PCB interface. The methods could also be used to wirebond an IC to an IC, or to wirebond a PCB to a PCB to establish a PCB-to-PCB interface. Any interface of IC's and PCB's that requires manipulating the effective inductance of the resulting transmission line to compensate for wirebonding the IC's and PCB's could be accomplished using the methods of the present invention according to several embodiments.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for interfacing an IC to a PCB for a device, according to a desired operating frequency for said device, said method comprising the steps of:
   A) fixing said IC to a dielectric substrate;
   B) fastening said PCB to said substrate;
   C) bonding said IC to said PCB with a wire bond;

D) establishing a ground plane for said PCB; and,

E) defecting said ground plane by forming at least one rectangular opening in said ground plane, when said operating frequency is in the microwave frequency range.

2. A method for extending the operating frequency range of a device, said device having an IC and a PCB interconnected with a groundwire, and said PCB further having a ground plane, wherein said IC has an IC network inductance and said PCB has a PCB network inductance, and said method is accomplished without matching said IC network and PCB network inductances, said method comprising the step of establishing a defect in said ground plane.

3. The method of claim 2, wherein said operating device in in the microwave region and said geometry is a rectangle.

4. A device, comprising:

a dielectric substrate;

an IC fixed to said substrate;

a PCB fixed to said substrate;

a bondwire connected to said IC and to said PCB;

a ground plane electrically connected to said PCB; and, said ground plane formed with a defect;

wherein said defect is a rectangular opening when said device is viewed in top plan and when a desired operating frequency for said device is in the microwave region.

* * * * *